United States Patent
Kim et al.

(10) Patent No.: US 8,319,291 B2
(45) Date of Patent: Nov. 27, 2012

(54) NON-VOLATILE MEMORY DEVICE WITH DATA STORAGE LAYER

(75) Inventors: Deok-kee Kim, Seoul (KR); June-mo Koo, Seoul (KR); Ju-chul Park, Suwon-si (KR); Kyoung-won Na, Seoul (KR); Dong-seok Suh, Seoul (KR); Bum-seok Seo, Yongin-si (KR); Yoon-dong Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 501 days.

(21) Appl. No.: 12/557,580

(22) Filed: Sep. 11, 2009

(65) Prior Publication Data
US 2010/0117054 A1    May 13, 2010

(30) Foreign Application Priority Data
Nov. 12, 2008    (KR) ............... 2008-0112221

(51) Int. Cl.
*H01L 47/00*    (2006.01)
(52) U.S. Cl. ............. 257/390; 257/225; 257/246
(58) Field of Classification Search .......... 257/390, 257/225, 246
See application file for complete search history.

(56) References Cited

U.S. PATENT DOCUMENTS

| | | | | |
|---|---|---|---|---|
| 4,881,114 A | * | 11/1989 | Mohsen et al. | 257/530 |
| 5,416,343 A | * | 5/1995 | Slotboom et al. | 257/209 |
| 5,464,989 A | * | 11/1995 | Mori et al. | 257/30 |
| 6,331,944 B1 | * | 12/2001 | Monsma et al. | 365/171 |
| 6,599,796 B2 | * | 7/2003 | Mei et al. | 438/243 |
| 6,624,485 B2 | * | 9/2003 | Johnson | 257/390 |
| 6,627,530 B2 | * | 9/2003 | Li et al. | 438/622 |
| 6,737,675 B2 | * | 5/2004 | Patel et al. | 257/67 |
| 6,770,939 B2 | * | 8/2004 | Subramanian et al. | 257/368 |
| 6,831,854 B2 | * | 12/2004 | Rinerson et al. | 365/158 |
| 7,598,512 B2 | * | 10/2009 | Chen | 257/2 |
| 7,990,754 B2 | * | 8/2011 | Azuma et al. | 365/148 |
| 8,058,636 B2 | * | 11/2011 | Osano et al. | 257/2 |
| 2007/0114508 A1 | | 5/2007 | Herner et al. | |
| 2007/0132049 A1 | * | 6/2007 | Stipe | 257/421 |
| 2007/0236981 A1 | | 10/2007 | Herner | |
| 2008/0128853 A1 | | 6/2008 | Choi et al. | |

FOREIGN PATENT DOCUMENTS

| | | | |
|---|---|---|---|
| JP | 02094468 A | * | 4/1990 |
| KR | 1020080043173 A | | 5/2008 |

* cited by examiner

*Primary Examiner* — Eugene Lee
(74) *Attorney, Agent, or Firm* — Valentine & Whitt, PLLC (57) ABSTRACT

Provided is a non-volatile memory device including at least one horizontal electrode, at least one vertical electrode, at least one data storage layer and at least one reaction prevention layer. The least one vertical electrode crosses the at least one horizontal electrode. The at least one data storage layer is located in regions in which the at least one vertical electrode crosses the at least one horizontal electrode, and stores data by varying its electrical resistance. The at least one reaction prevention layer is located in the regions in which the at least one vertical electrode crosses the at least one horizontal electrode.

12 Claims, 12 Drawing Sheets

NON-VOLATILE MEMORY DEVICE WITH DATA STORAGE LAYER

PRIORITY CLAIM

A claim of priority is made to Korean Patent Application No. 10-2008-0112221, filed on Nov. 12, 2008, in the Korean Intellectual Property Office, the subject matter of which is hereby incorporated by reference.

SUMMARY

Various embodiments relate to a semiconductor device, and more particularly, to a non-volatile memory device using a data storage layer configured to store a change in electrical resistance of the data storage layer.

Despite decreases in size, semiconductor products are required to process larger amount of data. Accordingly, improvements in operating speed and integration density of non-volatile memory devices used in semiconductor products are required. Generally, non-volatile memory devices having a multi-layer structure have higher integration density than typical non-volatile memory devices having a single-layer structure.

Generally, multi-layer structure non-volatile memory devices include memory cells that are stacked in a space that is substantially the same as that occupied by single-layer structure non-volatile memory devices. However, in multi-layer structure non-volatile memory devices, connection of the memory cells in each layer and selection of the memory cells in each layer are difficult.

According to an aspect of the inventive concept, there is provided a non-volatile memory device including at least one horizontal electrode, at least one vertical electrode, at least one data storage layer and at least one reaction prevention layer. The least one vertical electrode crosses the at least one horizontal electrode. The at least one data storage layer is located in regions in which the at least one vertical electrode crosses the at least one horizontal electrode, and stores data by varying its electrical resistance. The at least one reaction prevention layer is located in the regions in which the at least one vertical electrode crosses the at least one horizontal electrode.

The at least one reaction prevention layer may include first reaction prevention layers, located between the at least one horizontal electrode and the at least one data storage layer, and/or second reaction prevention layers, located between the at least one vertical electrode and the at least one data storage layer. Also, the at least one reaction prevention layer may include an oxide layer, a nitride layer, an oxinitride layer, or a layer formed of a combination thereof.

The at least one data storage layer may include at least any one of an aluminum oxide, a bismuth oxide, a titanium oxide, a vanadium oxide, a niobium oxide, a nickel oxide, a copper oxide, a zinc oxide, a tin oxide, a zirconium oxide, a silicon oxide, a hafnium oxide, a cobalt oxide, an iron oxide, carbon, and silicon. Also, the at least one data storage layer may include at least one fuse or at least one anti-fuse.

The at least one horizontal electrode and the at least one vertical electrode may cross each other at a right angle. Also, the at least one horizontal electrode and at least one vertical electrode may include polysilicon or metal, such as tungsten (W), aluminum (Al), copper (Cu), molybdenum (Mo), titanium (Ti), tantalum (Ta), ruthenium (Ru), platinum (Pt), palladium (Pd), nickel Hi), gold (Au), silver (Ag), beryllium (Be), bismuth (Ei), hafnium (Hf), indium (In), manganese (Mn), molybdenum (Mo), lead (Pb), rhodium (Rh), rhenium (Re), tellium (Te), zinc (Zn), zirconium (Zr), cobalt (Co), iridium (Ir), an alloy thereof, an oxide thereof, a nitride thereof, or a silicide thereof.

According to another aspect of the inventive concept, there is provided a non-volatile memory device including at least one horizontal electrode having a first conductive type semiconductor and at least one vertical electrode having a second conductive type semiconductor arranged to cross the at least one horizontal electrode, the second conductive type semiconductor being opposite to the first conductive type semiconductor. The non-volatile memory device further includes at least one data storage layer, located in regions in which the at least one horizontal electrode and the at least one vertical electrode cross each other, the at least one data storage layer storing data by varying its electrical resistance, and at least one reaction prevention layer located in the regions in which the at least one horizontal electrode and the at least one vertical electrode cross each other.

According to another aspect of the inventive concept, there is provided a non-volatile memory device including multiple horizontal electrodes, multiple vertical electrodes, at least one data storage layer and at least one reaction prevention layer. The horizontal electrodes are stacked in multiple layers. The vertical electrodes are arranged in multiple rows crossing the horizontal electrodes. The at least one data storage layer is located in regions in which the rows cross the horizontal electrodes, the at least one data storage layer storing data by varying its electrical resistance. The at least one reaction prevention layer is located between the horizontal electrodes and the at least one data storage layer and between the vertical electrodes and the at least one data storage layer.

The at least one data storage layer may extend across the horizontal electrodes stacked in the multiple layers.

BRIEF DESCRIPTION OF THE DRAWINGS

Various embodiments of the inventive concept will be described in further detail with reference to the attached drawings, in which.

DETAILED DESCRIPTION OF THE EMBODIMENTS

Various embodiments will now be described more fully with reference to the accompanying drawings, in which illustrative embodiments are shown. The inventive concept, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. In the drawings, thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Throughout the drawings and written description, like reference numerals will be used to refer to like or similar elements. As used herein, the term "and/or" includes any and all combinations of one or more of the associated listed items.

It will be understood that although the terms first, second, third, etc., may be used to describe various elements, components, regions, layers and/or sections, these elements, components, regions, layers and/or sections should not be limited by these terms. These terms are only used to distinguish one element, component region, layer or section from another region, layer or section. Thus, a first element, component, region, layer or section discussed below could be termed a second element, component, region, layer or section without departing from the present teachings.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of fabrication or manufacturing techniques and/or tolerances, are to be expected. Thus, exemplary embodiments should not be construed as limited to the particular shapes of regions illustrated herein but may be construed to include deviations in shapes that result, for example, from manufacturing. For example, an implanted region illustrated as a rectangle may actually have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of the embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, one or more embodiments are described with reference to the accompanying drawings schematically illustrating exemplary embodiments. In the drawings, transformation of forms in the drawings may be expected according to a fabrication or manufacturing technique and/or tolerance. Accordingly, embodiments are not limited to the specific forms illustrated in the drawing and may include, for example, changes in the forms which may occur during manufacturing.

Figure 1:
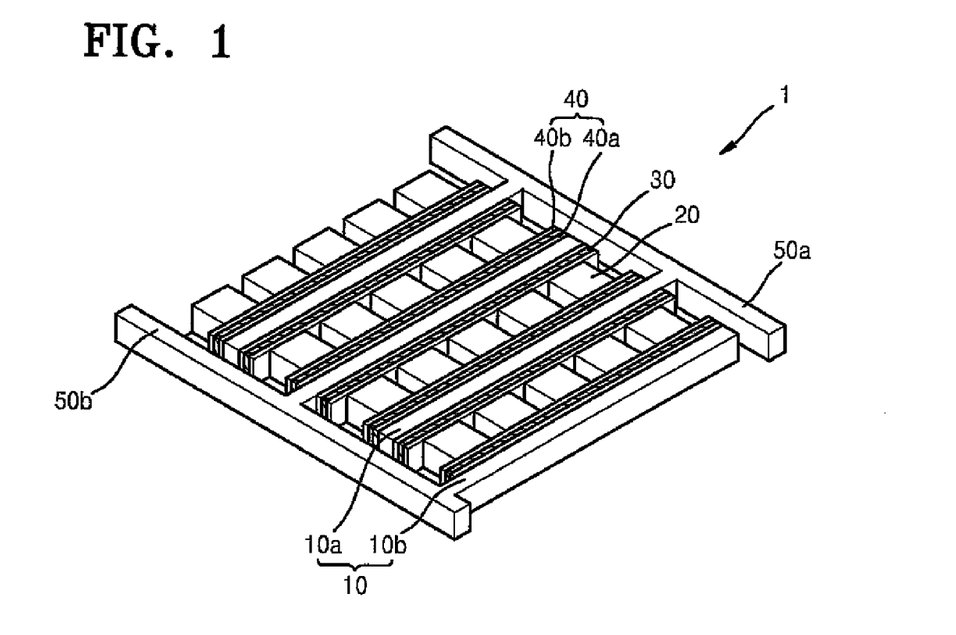
FIG. 1 is a perspective view of a non-volatile memory device, according to an illustrative embodiment.

FIG. 1 is a perspective view of a non-volatile memory device 1, according to an illustrative embodiment.

Referring to FIG. 1, the non-volatile memory device 1 includes at least one horizontal electrode 10, at least one vertical electrode 20, at least one data storage layer 30, and at least one reaction prevention layer 40.

The horizontal electrodes 10 and the vertical electrodes 20 are arranged to intersect or to cross each other. In the depicted embodiment the vertical electrodes 20 are positioned between a pair of horizontal electrodes 10, such that the vertical electrodes 20 extend in a direction perpendicular to that of the horizontal electrodes 10, i.e., forming 90 degree angles. However, the various embodiments are not limited to the perpendicular arrangement of horizontal and vertical electrodes 10 and 20 with respect to one another. For example, the horizontal electrodes 10 and the vertical electrodes 20 may be arranged to cross each other at predetermined angles other than 90 degrees.

The number of horizontal electrodes 10 and vertical electrodes 20 illustrated in FIG. 1 is only an example. The number of vertical electrodes 20 may be appropriately selected according to the number and the length of the horizontal electrodes 10. Accordingly, the various embodiments are not limited to the number of horizontal electrodes 10 and vertical electrodes 20 illustrated in FIG. 1. Also, the vertical electrodes 20 are shown as pillars having substantially square cross-sections. However, the various embodiments are not limited to this shape, and the vertical electrodes 20 may have various different forms, such as polygonal cross-sections or circular cross-sections (e.g., cylinders).

The horizontal electrodes 10 and the vertical electrodes 20 may be formed of semiconductor layers, for example, such as epitaxial layers or polysilicon layers, or a metal, for example, including tungsten (W), aluminum (Al), copper (Cu), molybdenum Mo), titanium (Ti), tantalum (Ta), ruthenium (Ru), platinum (Pt), palladium (Pd), nickel (Ni), gold (Au), silver (Ag), beryllium (Be), bismuth (Bi), hafnium (Hf), indium (In), manganese (Mn), molybdenum (Mo), lead (Pb), rhodium (Rh), rhenium (Re), tellium (Te), zinc (Zn), zirconium (Zr), cobalt (Co), iridium (Ir), an alloy thereof, an oxide thereof, a nitride thereof, or a silicide thereof. In addition, the horizontal electrodes 10 and the vertical electrodes 20 may be respectively formed of a single layer or multi-layers having a stacked layer structure. However, the materials of which the horizontal electrodes 10 and the vertical electrodes 20 are formed are not limited thereto.

The data storage layers 30 are located in regions where the horizontal electrodes 10 and the vertical electrodes 20 cross each other. For example, the data storage layers 30 may extend along side walls of the horizontal electrodes 10 between the horizontal electrodes 10 and the vertical electrodes 20. The form of the data storage layers 30 illustrated in FIG. 1 is only an example, and may vary in other embodiments. For example, rather than extending the length of the horizontal electrodes 10, the data storage layers 30 may be a pattern located only in each crossing region.

The data storage layers 30 store data by varying their electrical resistance, and control flow of electrical current between the horizontal electrodes 10 and the vertical electrodes 20. For example, the data storage layers 30 may have variable resistive properties corresponding to a high resistance, a low resistance and insulation, one of which is selected according to applied voltage. Such variable resistive properties of the data storage layers 30 are used to store data in the non-volatile memory device.

Each data storage layer 30 may include at least one antifuse, such as a phase-change resistor or a variable resistor. In this case, the non-volatile memory device 1 operates as a phase-change random access memory (PRAM) or a resistance random access memory (RRAM). For example, the phase-change resistor may include a chalcogenide compound, such as GST (GeSb$_x$Te$_y$), and may have a state of high-resistance and a state of low-resistance according to the crystalline state of the phase-change resistor. The variable resistor differs from the phase-change resistor in that the electrical resistance of the variable resistor may be changed without a change of phase. However, the concept of variable resistors may be defined broadly, and thus may include phase-change resistors.

As another example, each data storage layer 30 may include at least one fuse formed of a dielectric breakdown material. For example, the data storage layers 30 may each include a dielectric material, such as an oxide, in which the dielectric characteristic is broken down according to an applied voltage. Since such a dielectric breakdown material may not recover its dielectric characteristics, the non-volatile memory device 1 may be used as a one-time programmable (OTP) memory. Despite potential disadvantages of one-time use, OTP memory may be used in products requiring significant memory capacity.

The data storage layers 30 may be formed of at least one of aluminum oxide, bismuth oxide, titanium oxide, vanadium oxide, niobium oxide, nickel oxide, copper oxide, zinc oxide, tin oxide, zirconium oxide, silicon oxide, hafnium oxide, cobalt oxide, iron oxide, carbon, and silicon, for example. However, the materials used to form the data storage layers 30 are not limited thereto.

When the data storage layers 30 are conductive, diode coupling may be formed between the horizontal electrodes 10 and the vertical electrodes 20, resulting in a rectification characteristic. For example, the horizontal electrodes 10 may include first conductive type semiconductors and the vertical electrodes 20 may include second conductive type semiconductors, where the second conductive type is opposite to the first conductive type. For example, the first conductive type and the second conductive type may be n-type and p-type, respectively, or vice versa The reaction prevention layers 40 are located in the regions where the horizontal electrodes 10 and the vertical electrodes 20 intersect or cross each other. The reaction prevention layers 40 may include first reaction prevention layers 40$a$, located between the horizontal electrodes 10 and the data storage layers 30, second reaction prevention layers 40$b$, located between the vertical electrodes 20 and the data storage layers 30, or both first reaction prevention layers 40$a$ and second reaction prevention layers 40$b$. Also, the reaction prevention layers 40, that is, the first reaction prevention layers 40$a$ and the second reaction prevention layers 40$b$, may be oxide layers, nitride layers, oxinitride layers, or combinations thereof. For example, the first reaction prevention layers 40$a$ and the second reaction prevention layers 40$b$ may include silicon oxide, silicon nitride, or silicon oxinitride. In addition, the first reaction prevention layers 40$a$ and the second reaction prevention layers 40$b$ may be single material layers including one material of silicon oxide, silicon nitride or silicon oxinitride, multi-layers including stacked single material layers respectively including silicon oxide, silicon nitride or silicon oxinitride, or complex layers including at least two of silicon oxide, silicon nitride or silicon oxinitride. The reaction prevention layers 40 prevent the data storage layers 30 from forming silicide due to spontaneously reacting with the horizontal electrodes 10 and/or vertical electrodes 20, both of which may be formed of polysilicon. A more detailed description is given below.

The non-volatile memory device 1 according to the present embodiment forms memory cells. For example, the horizontal electrodes 10 may function as word lines and the vertical electrodes 20 may function as bit lines, or vice versa.

Hereinafter, representative configuration and operation of the non-volatile memory device 1, in which the horizontal electrodes 10 function as word lines and the vertical electrodes 20 function as bit lines, are described. The horizontal electrodes 10 include first horizontal electrodes 10$a$ and second horizontal electrodes 10$b$. The first horizontal electrodes 10$a$ are electrically connected to a first word line 50$a$ and the second horizontal electrodes 10$b$ are electrically connected to a second word line 50$b$. The first word line 50$a$ and the second word line 50$b$ may be located on opposite sides from each other, with the first horizontal electrodes 10$a$ and the second horizontal electrodes 10$b$ located between the first word line 50$a$ and the second word line 50$b$. For example, the first word line 50$a$ may be connected to one end of the first horizontal electrodes 10$a$ and the second word line 50$b$ may be connected to an opposite end of the second horizontal electrodes 10$b$.

In the non-volatile memory device 1, a memory cell is formed by one of the first horizontal electrode 10$a$ or second horizontal electrode 10$b$, the vertical electrode 20, and the data storage layer 30 located between the first horizontal electrode 10$a$ or second horizontal electrode 10$b$ and the vertical electrode 20, at crossing region. The first horizontal electrodes 10$a$ and the second horizontal electrodes 10$b$ may be accessed through the first word line 50$a$ and the second word line 50$b$, respectively. Accordingly, a memory cell may be accessed by selecting the associated first word line 50$a$ or second word line 50$b$, and the vertical electrode 20.

A memory cell may be programmed by applying a program voltage to one of the first word line 50$a$ and the second word line 50$b$, and to the vertical electrode 20. In this case, the change of electrical resistance occurs locally in the data storage layers 30 due to a concentration of electrical current, the data storage layers 30 being closely disposed between the vertical electrode 20 and one of the first horizontal electrodes 10a and the second horizontal electrodes 10b. Accordingly, programming may be locally performed in the data storage layers 30. A memory cell may be read by applying a reading voltage to one of the first word line 50a and the second word line 50b, and the vertical electrode 20. In this case, a local change of electrical resistance in the data storage layers 30 may be measured in terms of an amount of electrical current.

Figure 2:
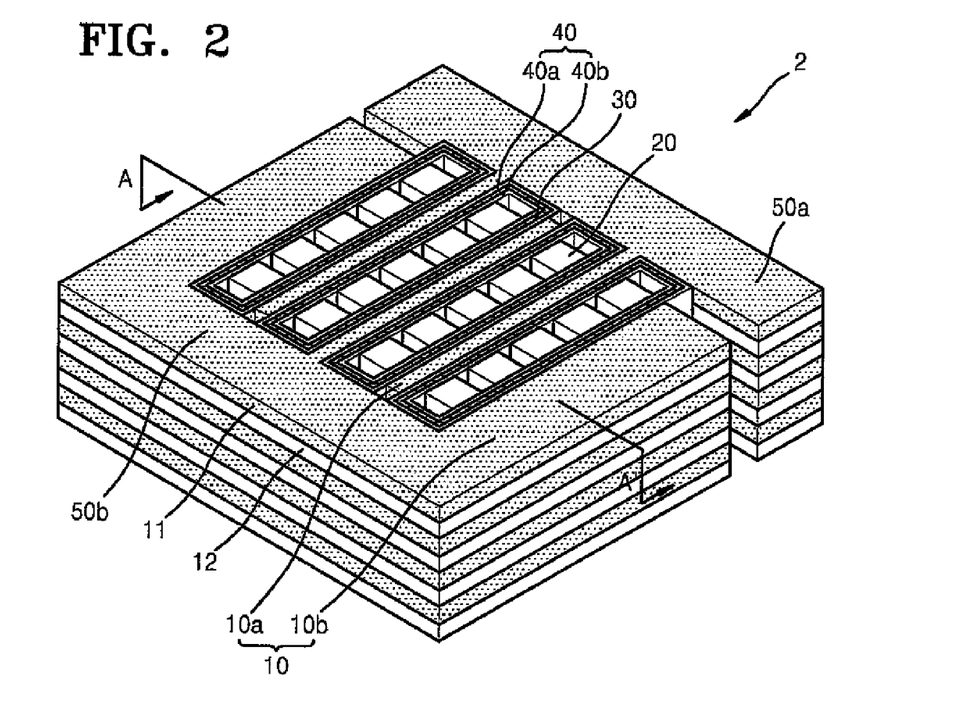
FIG. 2 is a perspective view of a non-volatile memory device having a stacked-layer structure, according to an illustrative embodiment.
Figure 3:
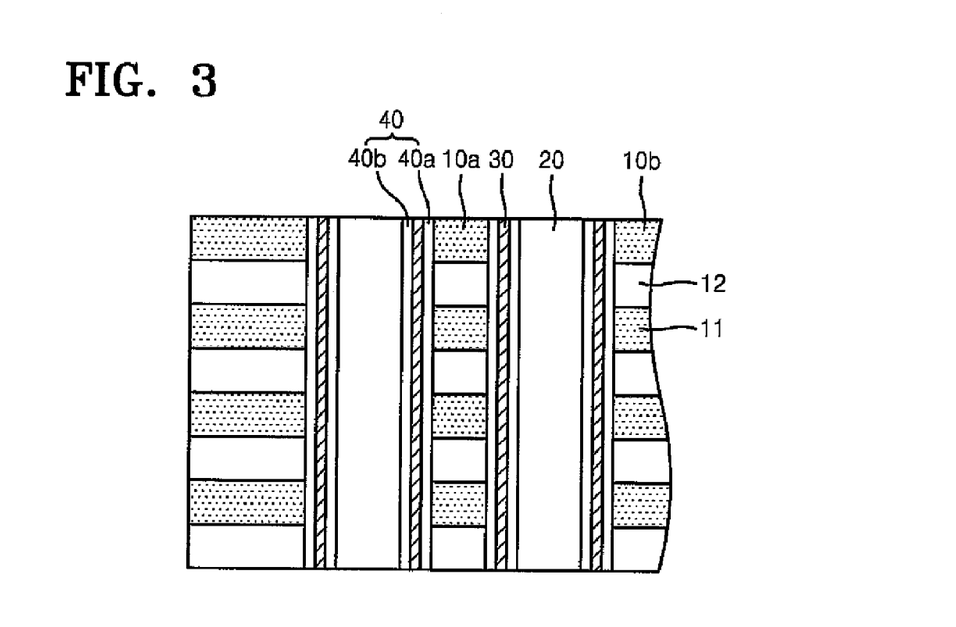
FIG. 3 is a cross-sectional diagram of the non-volatile memory device having a stacked-layer structure of FIG. 2, which is taken along the line A-A' of FIG. 2, according to an illustrative embodiment.

FIG. 2 is a perspective view of a non-volatile memory device 2 having a stacked-layer structure, and FIG. 3 is a cross-sectional diagram of the non-volatile memory device 2 of FIG. 2 taken along line A-A' of FIG. 2, according to an illustrative embodiment. The non-volatile memory device 2 may incorporate the non-volatile memory device 1 shown in FIG. 1, for example, and thus corresponding description will not be repeated.

Referring to FIGS. 2 and 3, the non-volatile memory device 2 includes multiple horizontal electrodes 10, multiple vertical electrodes 20, at least one data storage layer 30 and at least one reaction prevention layer 40, where the horizontal electrodes 10 are formed of stacked layers. The vertical electrodes 20 are formed in multiple rows, so as to cross the horizontal electrodes 10. The at least one data storage layer 30 is positioned in the regions where the horizontal electrodes 10 and the vertical electrodes 20 cross each other, and stores data by varying its electrical resistance. The at least one reaction prevention layer 40 is positioned between the horizontal electrodes 10 and the at least one data storage layer 30, and/or between the vertical electrodes 20 and the at least one data storage layer 30.

The non-volatile memory device 2 may be formed of the non-volatile memory devices 1 of FIG. 1, which are stacked in multiple layers. For example, the horizontal electrodes 10, that is, the first horizontal electrodes 10a and the second horizontal electrodes 10b, may be stacked in layers by depositing insulation layers 12 between electrode layers 11. Similarly, the first word lines 50a and the second word lines 50b also may be stacked in multiple layers by depositing insulation layers 12 between electrode layers 1. Accordingly, the first horizontal electrodes 10a and the second horizontal electrodes 10b are separated in each layer. Similarly, the first word lines 50a and the second word lines 50b are also separated in each layer.

The vertical electrodes 20 extend across the stacked layers of the first horizontal electrodes 10a and the second horizontal electrodes 10b. Thus, the vertical electrodes 20 may be shared by the stack of the first horizontal electrodes 10a and the second horizontal electrodes 10b, which are located in each different layer.

The data storage layers 30 may extend across the stacked layers of the first horizontal electrodes 10a and the second horizontal electrodes 10b. Also, the data storage layers 30 may further extend onto the sidewalls of the first word lines 50a and the second word lines 50b, thus forming an open rectangle, for example, surrounding outer walls of the vertical electrodes 20 in each row. As described above, the data storage layers 30 may locally store data by varying electrical resistance thereof, and thus may be shared with various forms in the memory cells.

The first reaction prevention layers 40a and the second reaction prevention layers 40b also may extend across the stacked layers of the first horizontal electrodes 10a and the second horizontal electrodes 10b. Also, the first reaction prevention layers 40a and the second reaction prevention layers 40b may further extend onto the sidewalls of the first word lines 50a and the second word lines 50b, and respectively may surround the outside and inside perimeters of each of the data storage layers 30, thus also forming open rectangles surrounding the outer walls of the vertical electrodes 20 in each row.

Operation of the non-volatile memory device 2 according to the present embodiment may be inferred from the operation of the non-volatile memory device 1 of FIG. 1, discussed above. The capacity of the non-volatile memory device 2 according to the present embodiment may be increased by increasing the number of the memory cells, for example, the number of first horizontal electrodes 10a and second horizontal electrodes 10b or the number of stacked layers. Accordingly, the non-volatile memory device 2 may be very highly integrated in the same plane, and thus may be suitable as a high-capacity and high-integration product.

Figure 4:
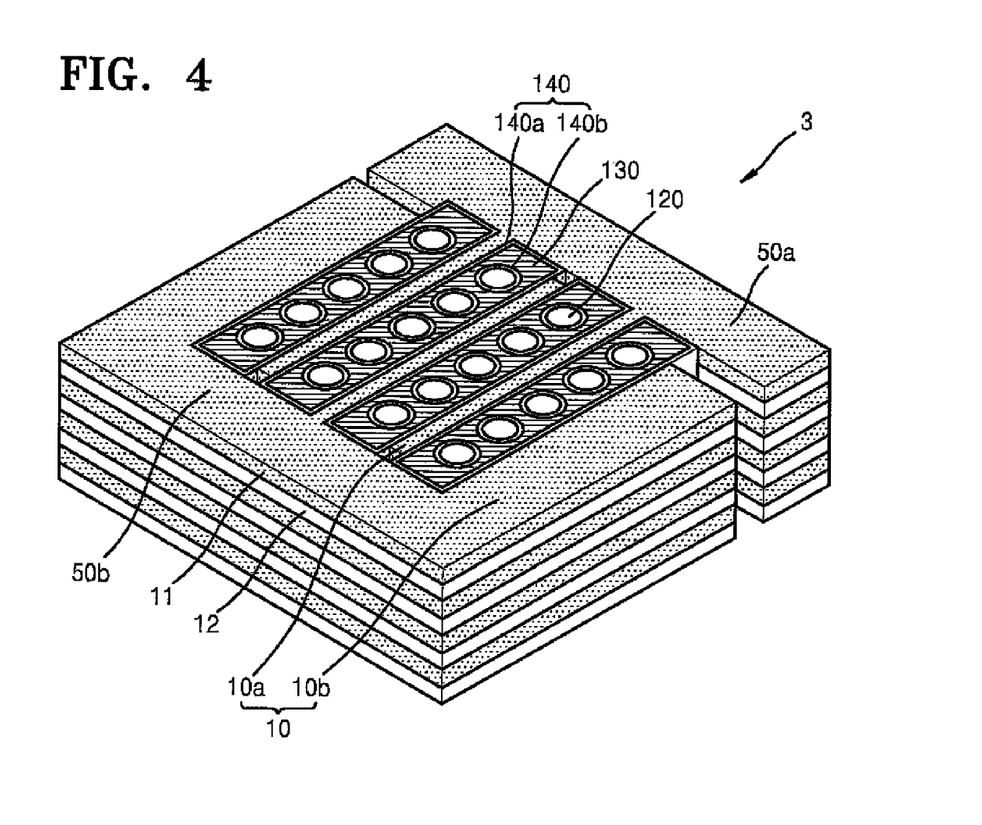
FIG. 4 is a perspective view of a non-volatile memory device having a stacked-layer structure, according to another illustrative embodiment.

FIG. 4 is a perspective view of a non-volatile memory device 3 having a stacked-layer structure, according to another illustrative embodiment. The non-volatile memory device 3 according to the present embodiment may be a modified form of the non-volatile memory device 2 of FIG. 2, and thus corresponding description will not be repeated.

Referring to FIG. 4, vertical electrodes 120 have a substantially cylindrical form and data storage layers 130 surround the vertical electrodes 120. Accordingly, the data storage layers 130 fill gaps between the first horizontal electrodes 10a and the second horizontal electrodes 10b, and the vertical electrodes 120 may be recessed into the data storage layers 130. Also, as described above, first reaction prevention layers 140a may surround the outside of the data storage layers 130, and the second reaction prevention layers 140b may surround openings in the data storage layers 130 for the vertical electrodes 120.

In the non-volatile memory device 3 according to the present embodiment, the change of electrical resistance of the data storage layers 130 may occur locally in the data storage layers 130, the data storage layers 30 being closely disposed between the vertical electrodes 120 and the first horizontal electrodes 10a and the second horizontal electrodes 10b. Accordingly, operation of the non-volatile memory device 3 according to the present embodiment is substantially the same as the operation of the non-volatile memory device 2 of FIG. 2, described above.

Figure 5A:
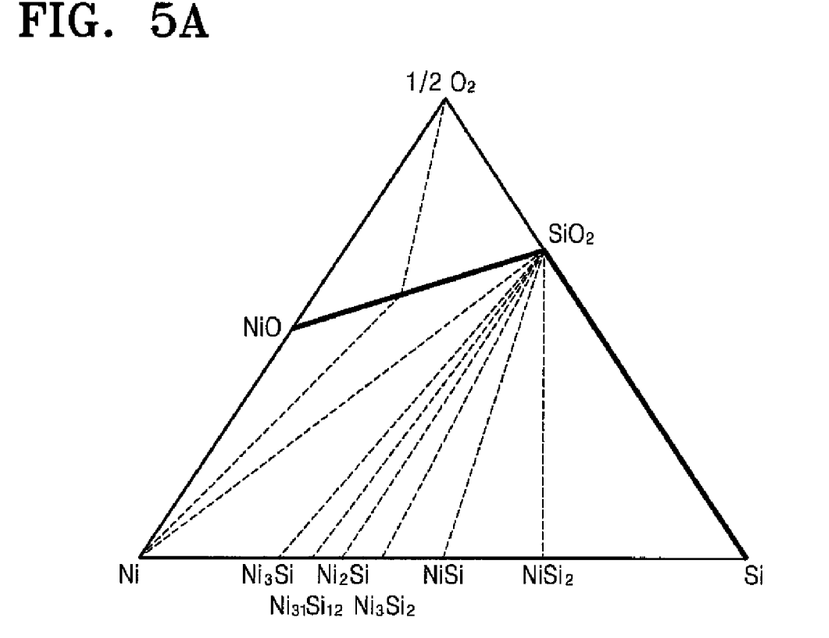
FIGS. 5A and 5B are a ternary phase diagram of nickel-silicon-oxygen and a ternary phase diagram of titanium-silicon-oxygen, respectively.
Figure 5B:
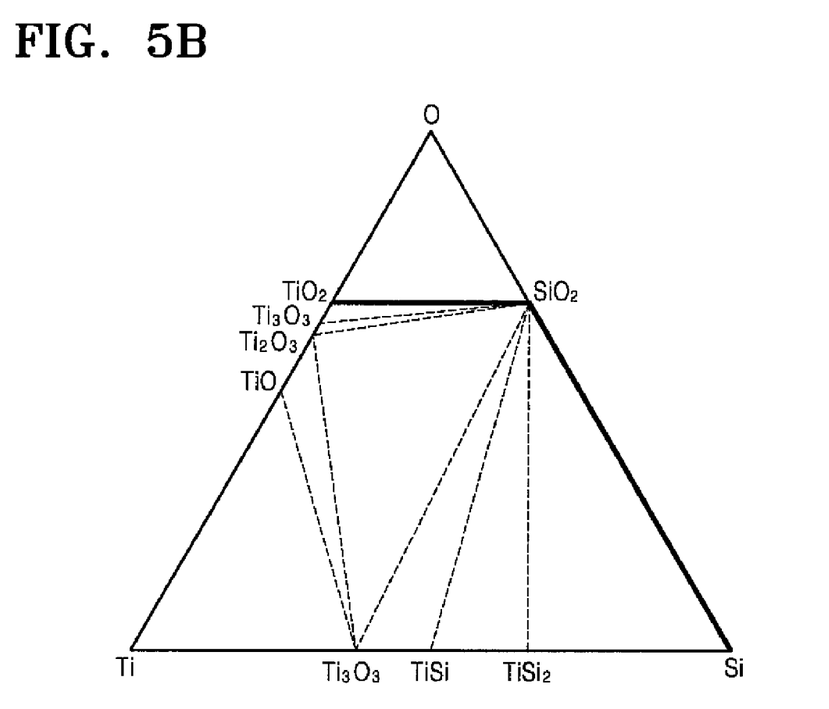

FIGS. 5A and 5B are ternary phase diagrams of nickel-silicon-oxygen and titanium-silicon-oxygen, respectively.

Referring to FIG. 5A, a nickel oxide NiO is thermodynamically unstable with silicon Si. Accordingly, when the data storage layers 30 are formed of nickel oxide NiO, and the first horizontal electrodes 10a, the second horizontal electrodes 10b and the vertical electrodes 20 are formed of polysilicon, a silicide reaction is spontaneously generated at the interface between the nickel oxide NiO and polysilicon. Thus, a silicide layer spontaneously formed due to the silicide reaction may not have a uniform interface, and properties of the semiconductor device may deteriorate due to an undesired reaction. However, nickel oxide NiO is thermodynamically stable with silicon oxide $SiO_2$, and silicon oxide $SiO_2$ is thermodynamically stable with silicon Si. The stability relationship may be understood with reference to the thick solid line illustrated in FIG. 5A. Thus, when the data storage layers 30 are formed of nickel oxide NiO, and the first horizontal electrodes 10a, the second horizontal electrodes 10b and the vertical electrodes 20 are formed of polysilicon, the first reaction prevention layers 40a and the second reaction prevention layers 40b formed of silicon oxide $SiO_2$ positioned therebetween (e.g., at the crossing regions) suppress a silicide reaction between the nickel oxide NiO and polysilicon, thus realizing a stable structure. If at least any one of the first horizontal electrodes 10a, the second horizontal electrodes 10b and the vertical electrodes 20 is formed of metal, the interface between the at least any one of the electrodes formed of the metal and the data storage layers 30 formed of nickel oxide NiO is thermodynamically stable, and thus the reaction prevention layers 40 may not have to be formed.

Referring to FIG. 5B, titanium oxide $TiO_2$ is not thermodynamically stable with silicon Si, similar to nickel oxide NiO. Accordingly, when the data storage layers 30 are formed of titanium oxide $TiO_2$, and the first horizontal electrodes 10a, the second horizontal electrodes 10b and the vertical electrodes 20 are formed of polysilicon, a silicide reaction is spontaneously generated on the interface between the titanium oxide $TiO_2$ and polysilicon. Thus, a silicide layer spontaneously formed due to the silicide reaction may not have a uniform interface, and properties of the semiconductor device may deteriorate due to an undesired reaction. However, the titanium oxide $TiO_2$ is thermodynamically stable with silicon oxide $SiO_2$, and the silicon oxide $SiO_2$ is thermodynamically stable with silicon Si. The stability relationship may be understood with reference to the thick solid line illustrated in FIG. 5B. Thus, when the data storage layers 30 are formed of titanium oxide $TiO_2$, when the first horizontal electrodes 10a, the second horizontal electrodes 10b and the vertical electrodes 20 are formed of polysilicon, and when the first reaction prevention layers 40a and the second reaction prevention layers 40b formed of silicon oxide $SiO_2$ are positioned therebetween, a silicide reaction of the titanium oxide $TiO_2$ and polysilicon may be suppressed, thereby realizing a stable structure. If at least any one of the first horizontal electrodes 10a, the second horizontal electrodes 10b and the vertical electrodes 20 is formed of metal, the interface between the at least any one of the electrodes formed of the metal and the data storage layers 30 formed of the titanium oxide $TiO_2$ is thermodynamically stable, and thus the reaction prevention layers 40 may not have to be formed The nickel oxide NiO and the titanium oxide $TiO_2$ illustrated in FIGS. 5A and 5B are only examples. Other materials for forming the data storage layers 30 may react with silicon, thereby respectively forming a silicide. Accordingly, when the data storage layers 30 are formed using such materials, the first reaction prevention layers 40a and the second reaction prevention layers 40b formed of silicon oxide $SiO_2$ are formed therebetween to realize a stable structure.

FIGS. 6A through 6J are perspective views illustrating a method of manufacturing the non-volatile memory device 2, according to an illustrative embodiment.

Figure 6A:
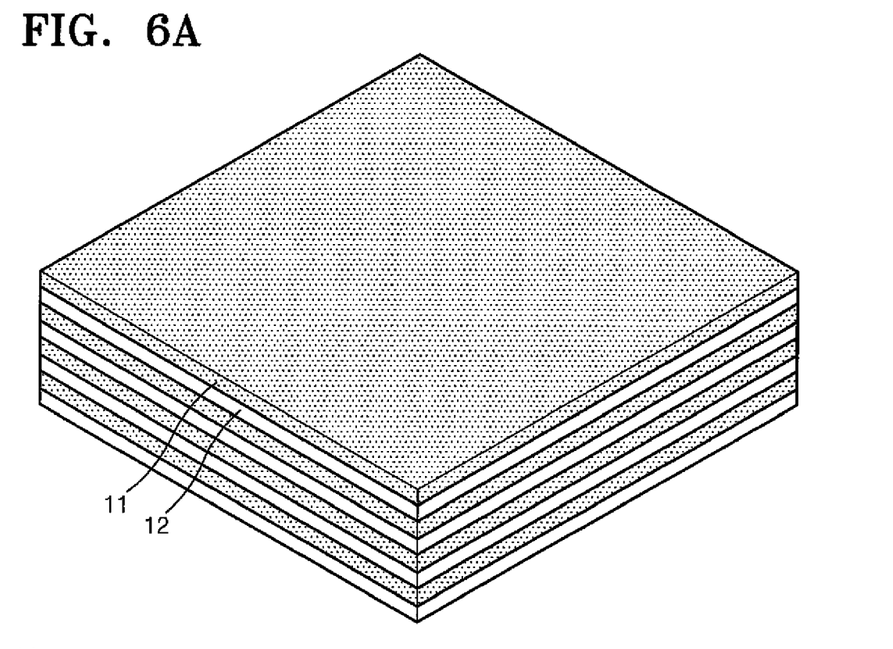
FIGS. 6A through 6J are perspective views illustrating a method of fabricating the non-volatile memory device of FIG. 2, according to an illustrative embodiment.

Referring to FIG. 6A, at least one first electrode layer 11 is stacked on at least one insulation layer 12. For example, multiple first electrode layers 11 and multiple insulation layers 12 may be alternately stacked. The first electrode layers 11 may be formed of semiconductor layers, for example, such as epitaxial layers or polysilicon layers, or a metal. Examples of the metal include tungsten (W), aluminum (Al), copper (Cu), molybdenum (Mo), titanium (Ti), tantalum (Fa), ruthenium (Ru), platinum (Pt), palladium (Pd), nickel (Ni), gold (Au), silver (Ag), beryllium (Be), bismuth (Bi), hafnium (Hf), indium (In), manganese (Ma), molybdenum (Mo), lead (Pb), rhodium (Rh), rhenium (Re), tellurium (Te), zinc (Zn), zirconium (Zr), cobalt (Co), iridium (r), an alloy thereof, an oxide thereof, a nitride thereof, or a silicide thereof. Also, the first electrode layer 11 may be doped with first conductive type impurities.

Figure 6B:
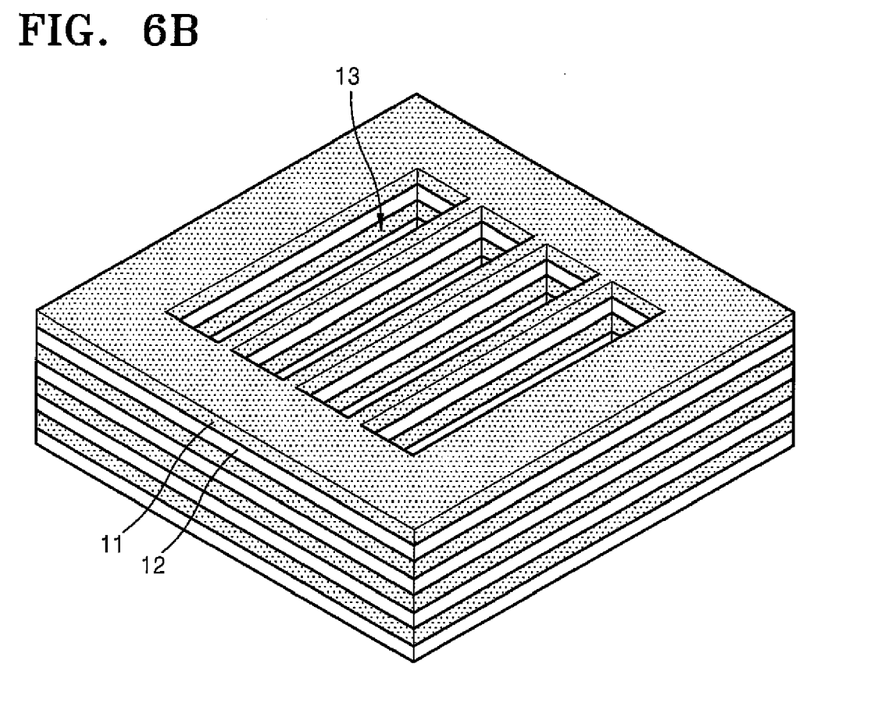

Referring to FIG. 6B, trenches 13 are formed in the stacked first electrode layers 11 and insulation layers 12. The trenches 13 may be formed using a photolithography process and/or etching process, for example. Portions of the first electrode layers 11 formed in rows along the sidewalls of the trenches 13 are defined as the first and second horizontal electrodes 10a and 10b in FIG. 6H. Moreover, portions of the first electrode layers 11 formed along the ends of the trenches 13 are defined as the first and second word lines 50a and 50b in FIG. 6H. Therefore, an appropriate number of the trenches 13 are formed according to the widths and number of the first and second horizontal electrodes 10a and 10b and first and second word lines 50a and 50b.

Figure 6C:
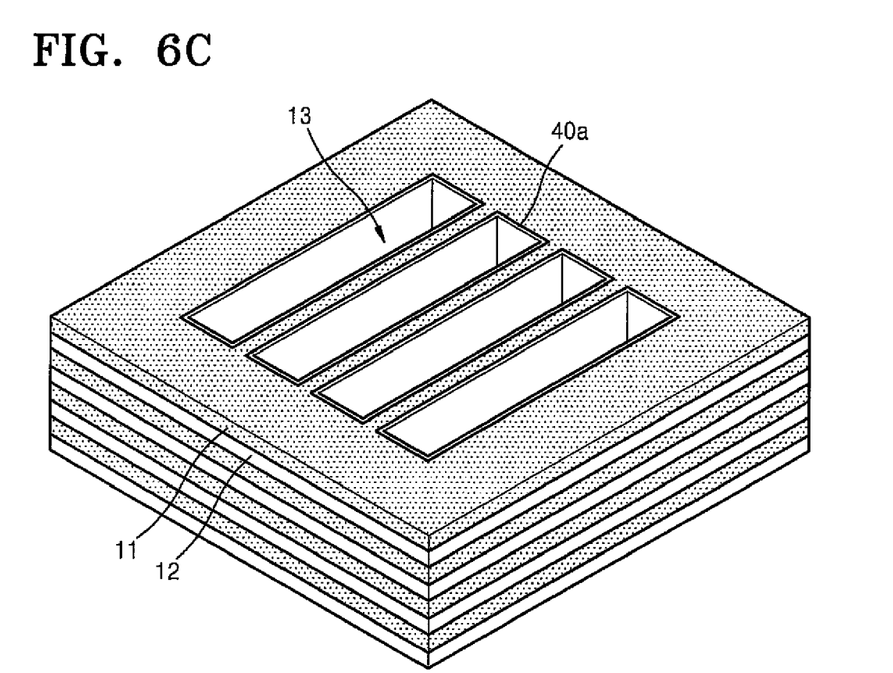

Referring to FIG. 6C, the first reaction prevention layers 40a are correspondingly formed in the trenches 13. The first reaction prevention layers 40a extend across the sidewalls of the first electrode layers 11 and have a predetermined thickness, so that the first reaction prevention layers 40a do not completely fill the trenches 13. The first reaction prevention layers 40a may be oxide layers, nitride layers, oxinitride layers or a combination thereof, such as silicon oxide layers, silicon nitride layers or silicon oxinitride layers, for example. Also, in various embodiments, when the first electrode layers 11 are formed of metal, as described above, the first reaction prevention layers 40a may not have to be formed.

Figure 6D:
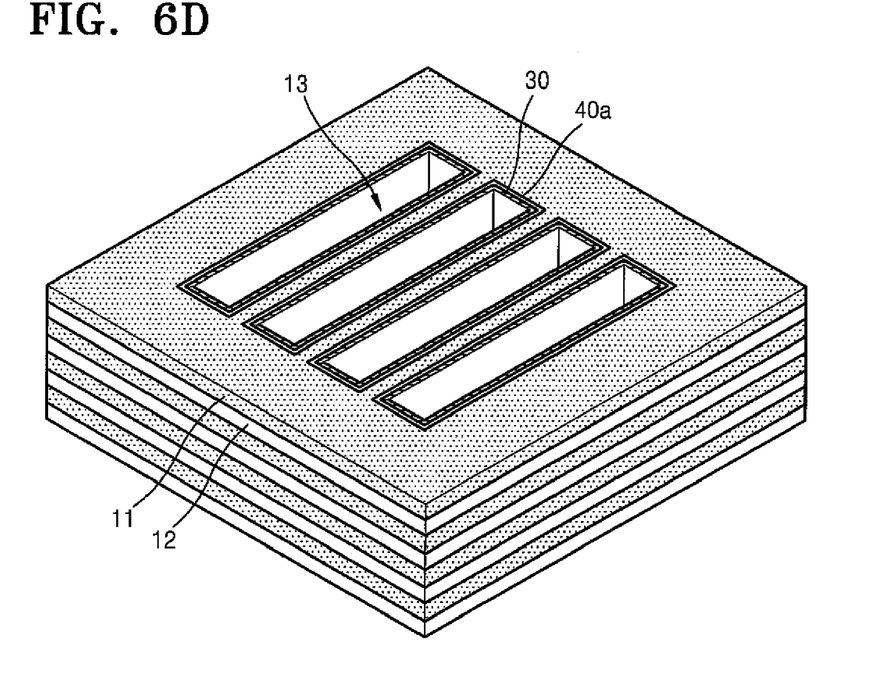

Referring to FIG. 6D, the data storage layers 30 are formed on the first reaction prevention layers 40a in the corresponding trenches 13. The data storage layers 30 extend across the sidewalls of the first electrode layers 11 and have a predetermined thickness, so that the data storage layers 30 do not completely fill the trenches 13. For example, the data storage layers 30 may be a material forming at least one fuse or at least one anti-fuse. The data storage layers 30 may include at least any one of aluminum oxide, bismuth oxide, titanium oxide, vanadium oxide, niobium oxide, nickel oxide, copper oxide, zinc oxide, tin oxide, zirconium oxide, silicon oxide, hafnium oxide, cobalt oxide, iron oxide, carbon and silicon.

Figure 6E:
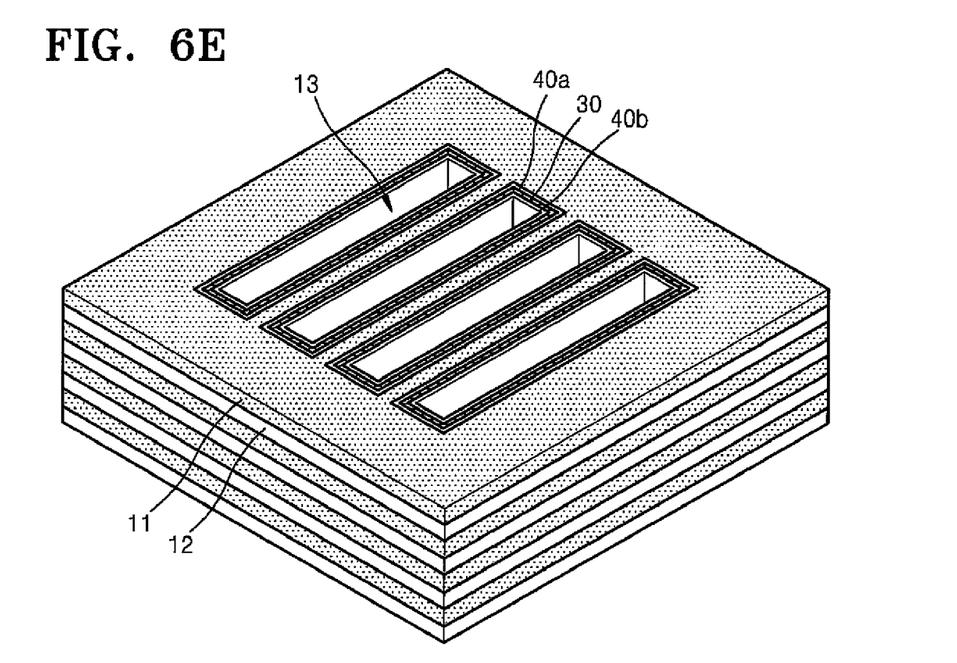

Referring to FIG. 6E, the second reaction prevention layers 40b are formed on the data storage layers 30 in the corresponding trenches 13. The second reaction prevention layers 40b extend across the sidewalls of the first electrode layers 11 and have a predetermined thickness, so that the second reaction prevention layers 40b do not completely fill the trenches 13. The second reaction prevention layers 40b may be formed of the same material as or different material from the first reaction prevention layers 40a. Also, in various embodiments, when the first electrode layers 11 are formed of metal, as described above, the second reaction prevention layers 40b may not have to be formed.

Figure 6F:
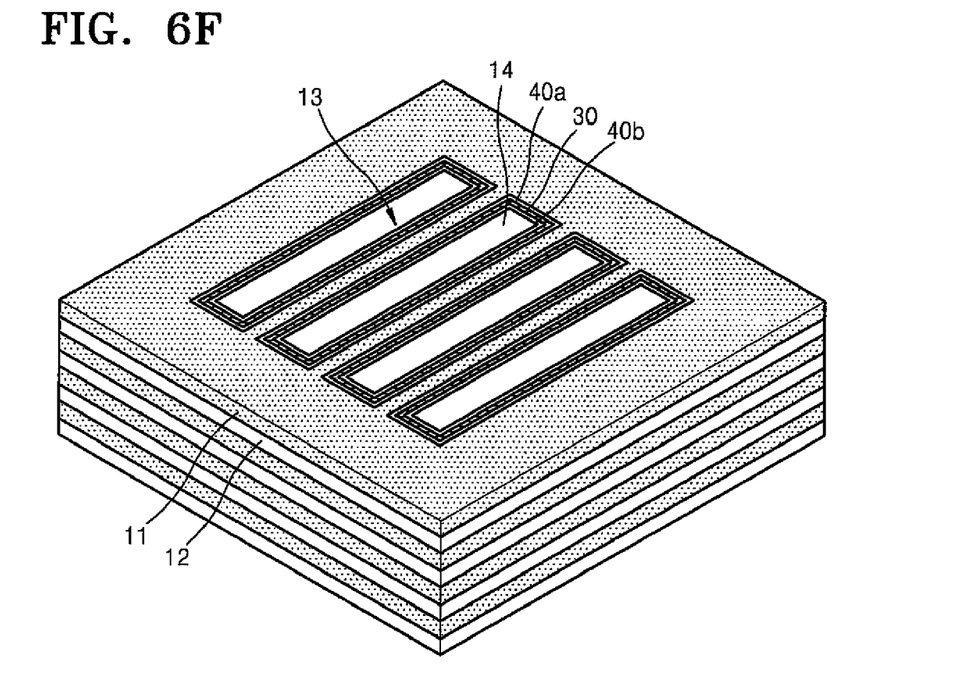

Referring to FIG. 6F, second electrode layers 14 are formed on the data storage layers 30 or the second reaction prevention layers 40b to fill the trenches 13. The second electrode layers 14 are subsequently used to form the vertical electrodes 20 (see FIG. 6G). The second electrode layers 14 may be formed of semiconductor layers, for example, such as epitaxial layers or polysilicon layers, or a metal. The second electrode layers 14 may be formed of the same material as or different material from the first electrode layers 11. Also, the second electrode layers 14 may be doped with second conductive type impurities, opposite to the first conductive type impurities. The second electrode layers 14 may be formed by forming a semiconductor layer or a metal layer using chemical vapour deposition and planarizing the semiconductor layer or the metal layer, for example. The planarization may be carried out using an etchback process or chemical-mechanical polishing (CMP), for example.

Figure 6G:
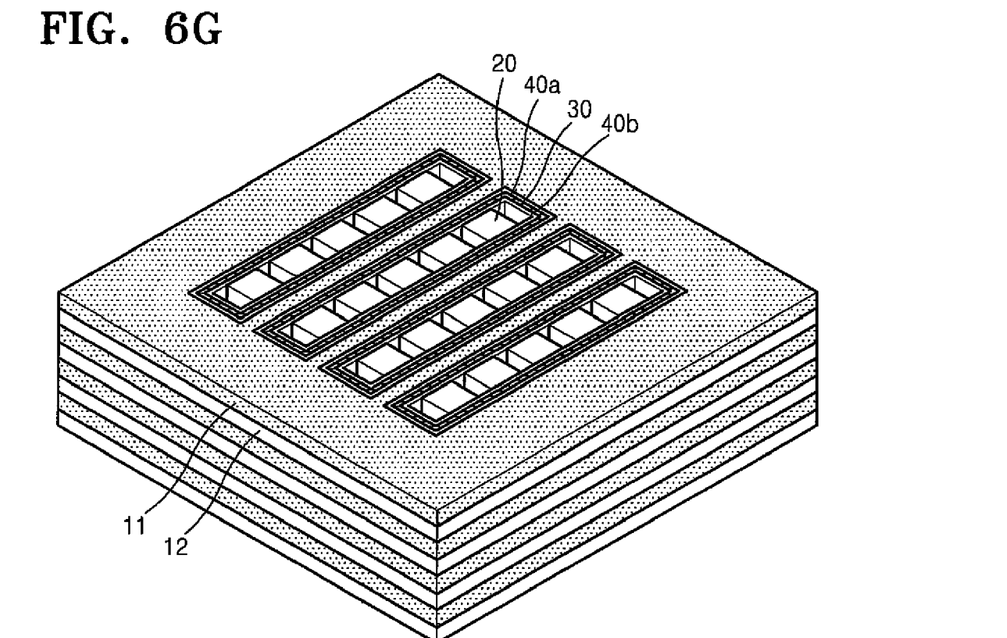

Referring to FIG. 6G, the second electrode layers 14 are patterned to form multiple vertical electrodes 20. The patterning may be performed using a photolithography process and/ or an etching process, for example. The vertical electrodes 20 may be patterned so that they are not electrically connected to each other.

Figure 6H:
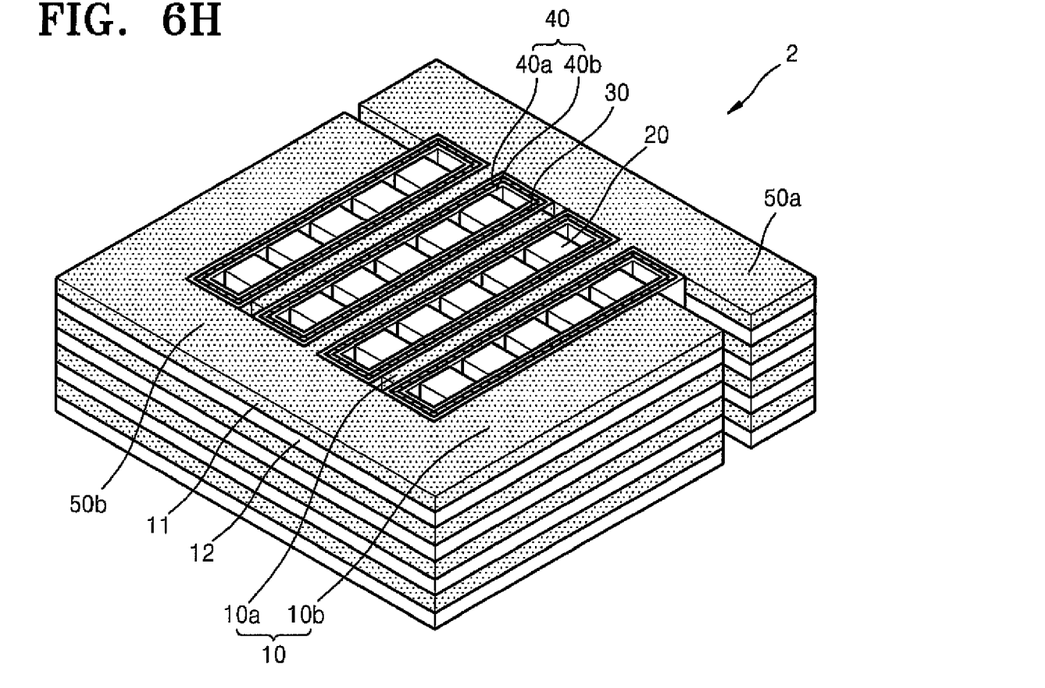

Referring to FIG. 6H, each of the first electrode layers 11 are appropriately separated to define first and second horizontal electrodes 10a and 10b and first and second word lines 50a and 50b. The first word line 50a may be electrically connected to the first horizontal electrodes 10a and separated from the second horizontal electrodes 10b. The second word line 50b may be electrically connected to the second horizontal electrodes 10b and separated from the first horizontal electrodes 10a. For example, the structure of FIG. 6H may be formed by cutting between the first horizontal electrodes 10a and the second word line 50b and between the second horizontal electrodes 10b and the first word line 50a in the structure of FIG. 6G. The cutting may be performed using a photolithography process and/or an etching process, for example.

Figure 6I:
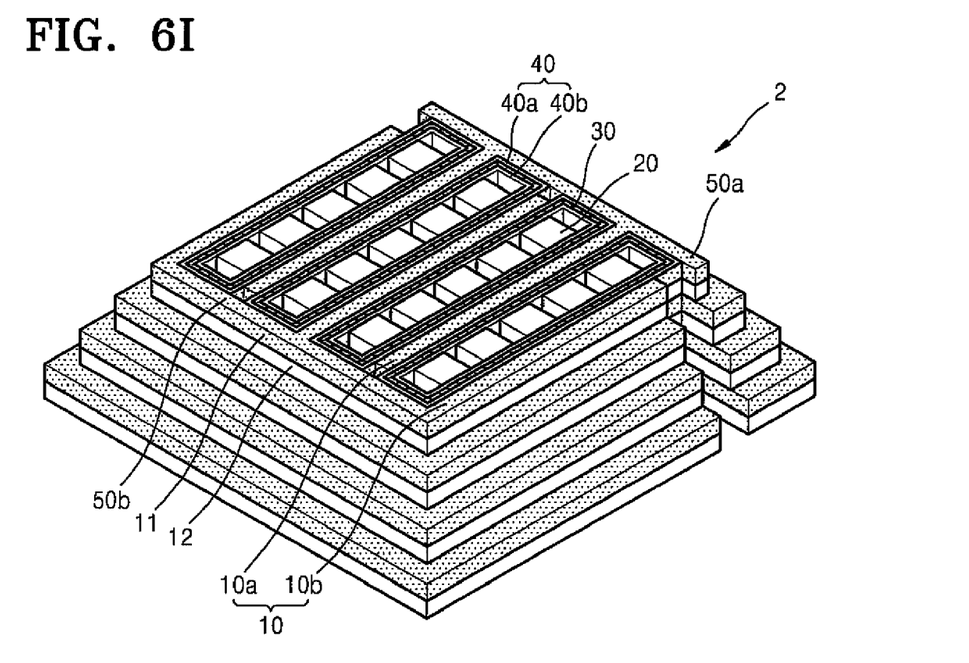

Referring to FIG. 6I, the first electrode layers 11 and the insulation layers 12 are patterned to provide a stepped structure. The patterning may be performed multiple times using a photolithography process and/or an etching process, for example. The depicted order in the fabrication process in which the stepped structure is formed is a non-limiting example. For example, in various embodiments, the stepped structure may be formed before or directly after forming the trenches 13 in the first electrode layers 11 and the insulation layers 12, as illustrated in FIG. 6B.

Figure 6J:
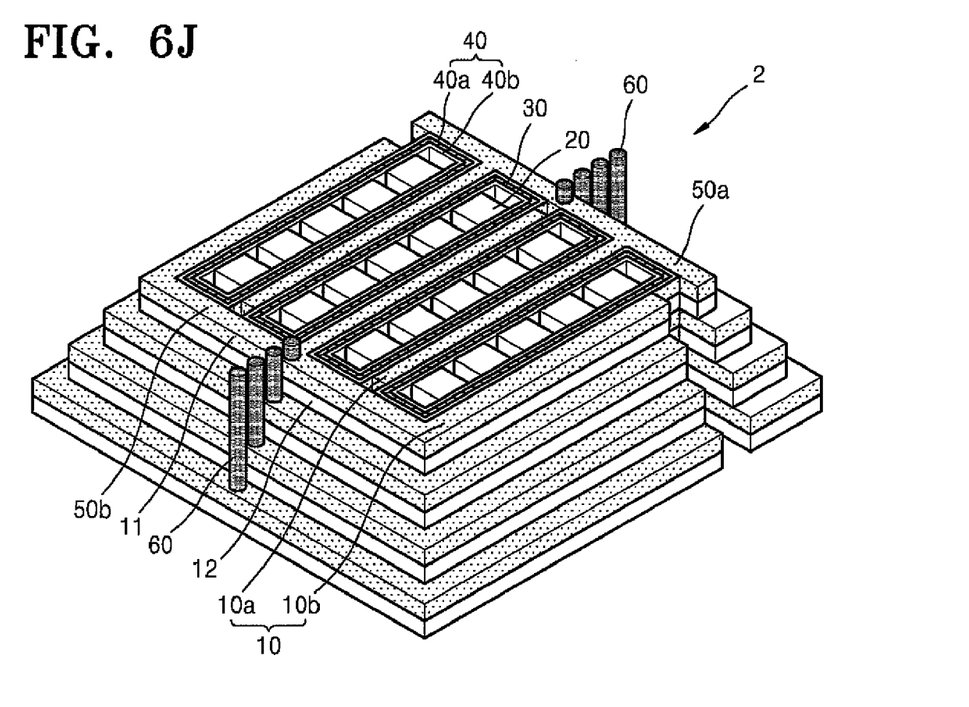

Referring to FIG. 6J, portions of the first electrode layers 11 are exposed as a result of forming the stepped structure. Contacts 60, which are electrically connected to the first electrode layers 11, are formed on the exposed portions of the first electrode layers 11. The first and second word lines 50a and 50b and the first and second horizontal electrodes 10a and 10b are electrically connected to the outside by the contacts 60.

According to the fabrication method of the present embodiment, memory cells having a stacked-layer structure may be formed simultaneously. Therefore, manufacturing operations are simplified and manufacturing costs may be reduced.

FIGS. 7A through 7G are perspective views illustrating a method of manufacturing the non-volatile memory device 3, according to an illustrative embodiment. The manufacturing method according to the present embodiment may be partially modified by using the manufacturing method illustrated in FIGS. 6A through 6I, and thus corresponding description will not be repeated. For example, the manufacturing operation illustrated in FIG. 7A may follow the manufacturing operations illustrated in FIGS. 6A through 6C.

Figure 7A:
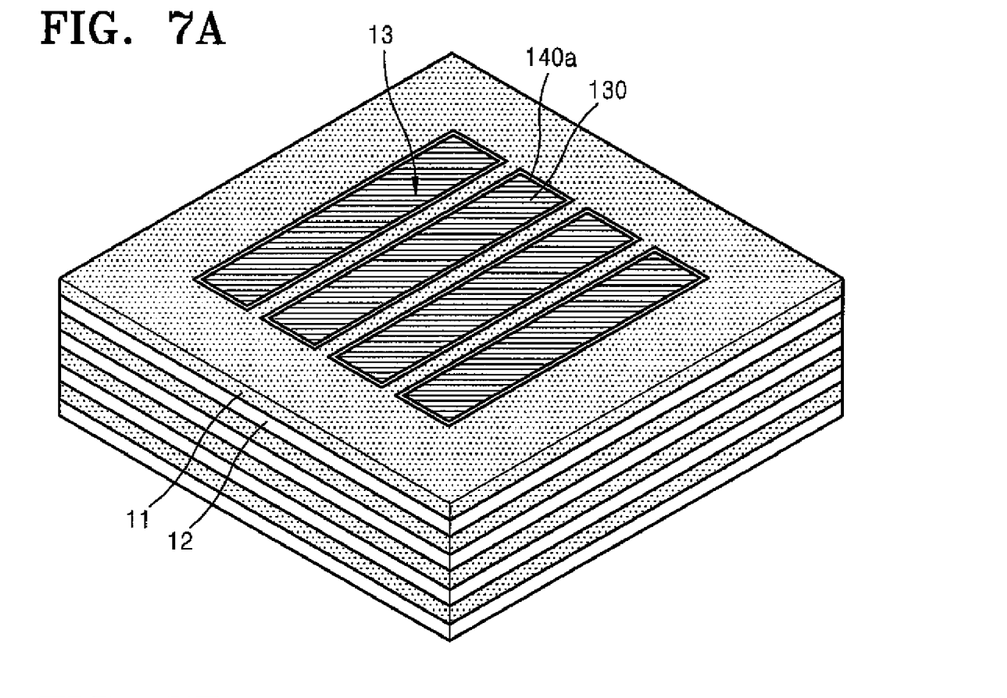
FIGS. 7A through 7G are perspective views illustrating a method of fabricating the non-volatile memory device of FIG. 4, according to an illustrative embodiment.

Referring to FIG. 7A, data storage layers 130 are formed on first reaction prevention layers 140a to fill corresponding trenches 13. The data storage layers 130 may be formed of a material for forming at least one fuse or at least one anti-fuse. The data storage layers 130 may be formed by using a chemical vapour deposition method, for example, and a planarization process. For example, the planarization process may be carried out by using etchback process or CMP.

Figure 7B:
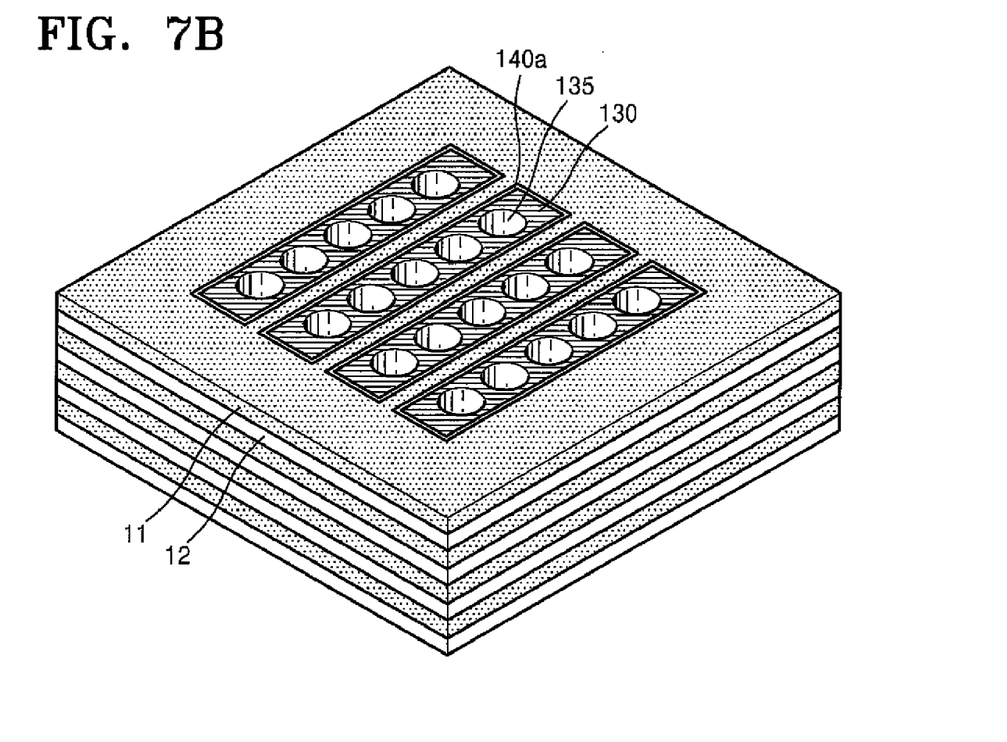

Referring to FIG. 7B, the data storage layers 130 are patterned to form multiple holes 135 in the data storage layers 130. The holes 135 may be formed using a photolithography process and/or an etching process, for example.

Figure 7C:
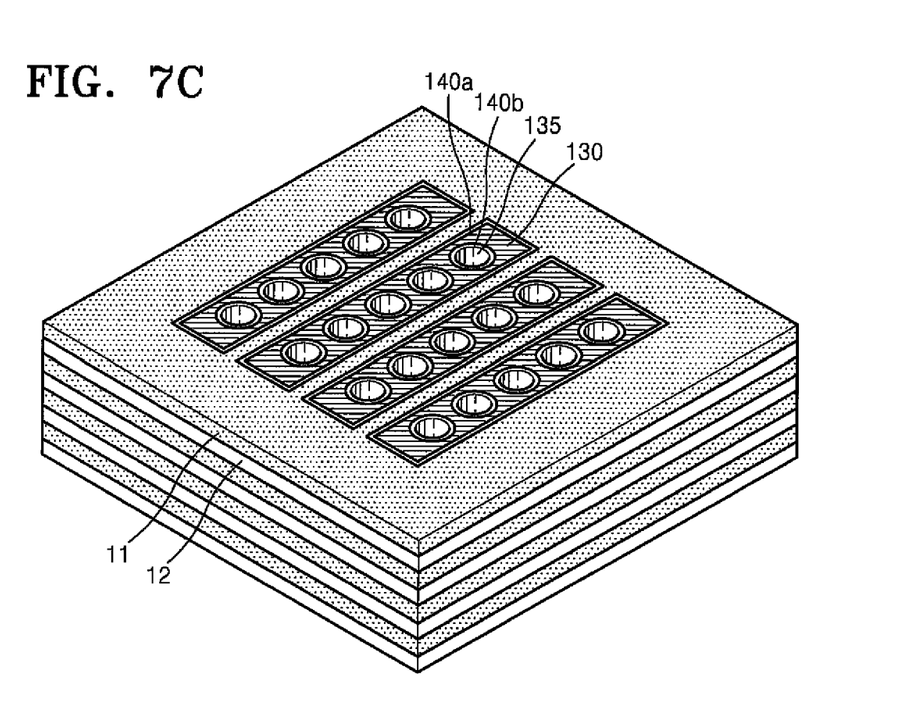

Referring to FIG. 7C, second reaction prevention layers 140b are formed in the holes 135. The second reaction prevention layers 140b may be formed on the sidewalls of the holes 135 to a predetermined thickness. Alternatively, the second reaction prevention layers 140b may be formed by filling the holes 135 using chemical vapour deposition, for example, and performing a planarization process, a photolithography process and/or an etching process to form the holes 135 with the second reaction prevention layers 140b on the sidewalls.

Figure 7D:
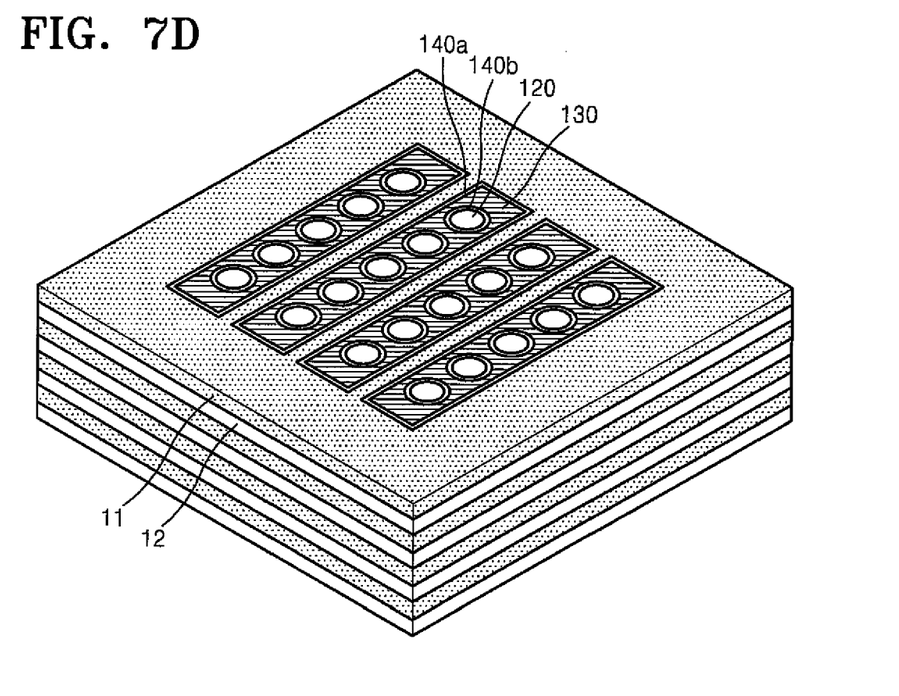

Referring to FIG. 7D, vertical electrodes 120 are formed on the second reaction prevention layers 140b. That is, the holes 135 may be filled in by the vertical electrodes 120. The vertical electrodes 120 may be formed by forming the second electrode layers using chemical vapour deposition, for example, and by performing a planarizing process of the second electrode layers. The vertical electrodes 120 may be formed of a second conductive type semiconductor.

Figure 7E:
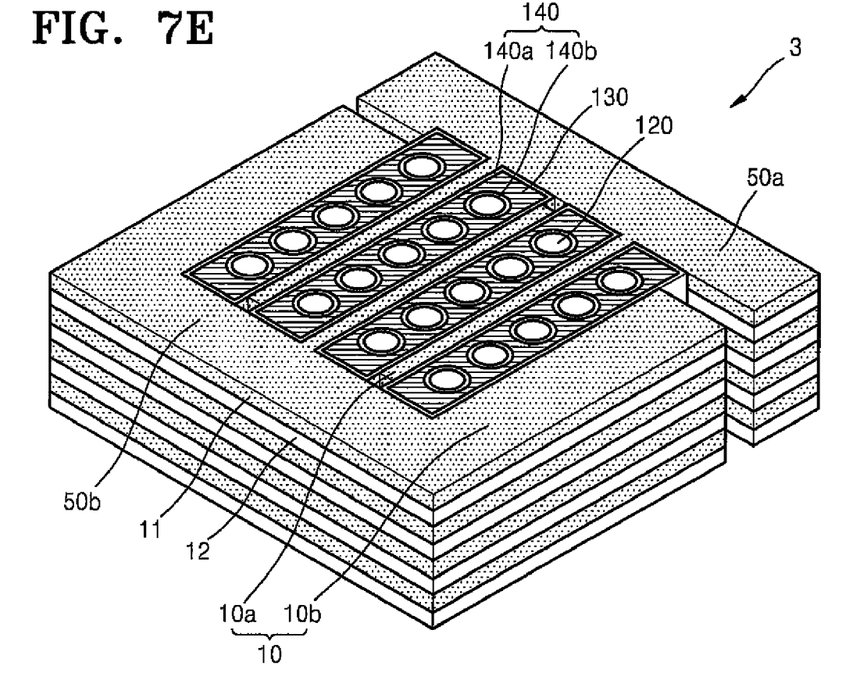

Referring to FIG. 7E, each of the first electrode layers 11 are appropriately separated to define first and second horizontal electrodes 10a and 10b and first and second word lines 50a and 50b. The first word line 50a may be electrically connected to the first horizontal electrodes 10a and separated from the second horizontal electrodes 10b. The second word line 50b may be electrically connected to the second horizontal electrodes 10b and separated from the first horizontal electrodes 10a. For example, the structure of FIG. 7E may be formed by cutting between the first horizontal electrodes 10a and the second word line 50b and between the second horizontal electrodes 10b and the first word line 50a in the structure of FIG. 7D. The cutting may be performed using a photolithography process and/or an etching process, for example.

Figure 7F:
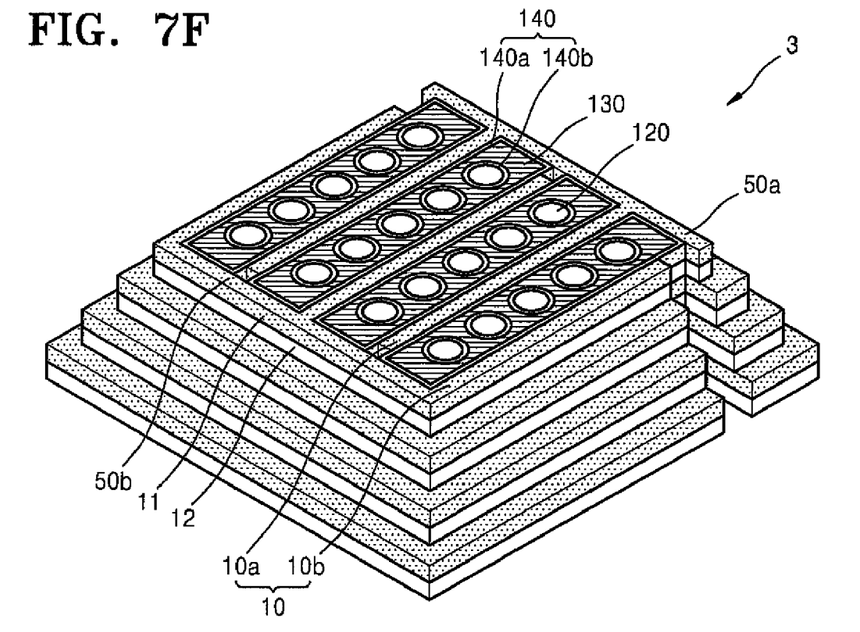

Referring to FIG. 7F, the first electrode layers 11 and the insulation layers 12 are patterned to provide a stepped structure. The patterning may be performed multiple times using a photolithography process and/or an etching process, for example. The depicted order of forming the stepped structure in the fabrication process in which the stepped structure is formed is a non-limiting example. For example, in various embodiments, the stepped structure may be formed before or directly after forming the trenches 13 in the first electrode layers 11 and the insulation layers 12, as illustrated in FIG. 6B.

Figure 7G:
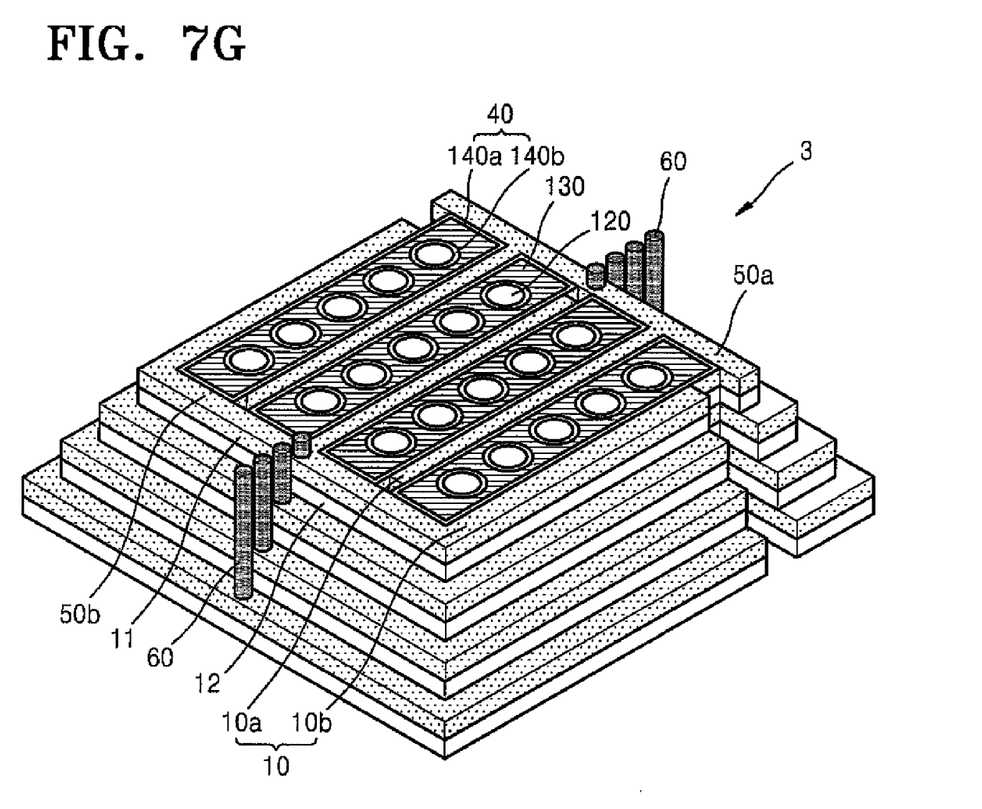

Referring to FIG. 7G, portions of the first electrode layers 11 are exposed at each step as a result of forming the stepped structure. Contacts 60, which are electrically connected to the first electrode layers 11, are formed on the exposed portions of the first electrode layers 11. The first and second word lines 50a and 50b and the first and second horizontal electrodes 10a and 10b are electrically connected to the outside by the contacts 60.

According to the fabrication method of the present embodiment memory cells having a stacked-layer structure may be formed simultaneously. Therefore, manufacturing operations are simplified and manufacturing costs may be reduced.

Thus, according to an aspect of the inventive concept, there is provided a method of manufacturing a non-volatile memory device. The method includes preparing multiple layers having a stacked structure of at least one first electrode layer and at least one insulation layer; forming trenches in the at least one first electrode layer and the at least one insulation layer; forming at least one first reaction prevention layer in the trenches; forming at least one data storage layer on the at least one first reaction prevention layer in the trenches; forming at least one second reaction prevention layer on the at least one data storage layer in the trenches; forming at least one second electrode layer on the at least one second reaction prevention layer to fill the trenches; patterning the at least one second reaction prevention layer to form vertical electrodes; and separating the at least one first electrode layer to form first and second horizontal electrodes and first and second word lines.

According to another aspect of the inventive concept, there is provided a method of manufacturing a non-volatile memory device. The method includes preparing multiple layers having a stacked structure of at least one first electrode layer and at least one insulation layer; forming multiple trenches in the at least one first electrode layer and the at least one insulation layer; forming at least one first reaction prevention layer in the trenches; forming at least one data storage layer on the at least one first reaction prevention layer to fill the trenches; patterning the at least one data storage layer to form multiple holes in the at least one data storage layer; forming at least one second reaction prevention layer on the surfaces of the holes; filling the holes to form multiple vertical electrodes on the at least one second reaction prevention layer; and separating the at least one first electrode layer to form first and second horizontal electrodes and first and second word lines.

While the present inventive concept has been described with reference to exemplary embodiments, it will be apparent to those skilled in the art that various changes and modifications may be made without departing from the spirit and scope of the present teachings. Therefore, it should be understood that the above embodiments are not limiting, but illustrative. Illustrative embodiments are defined by the following claims, with equivalents of the claims to be included therein.

What is claimed is:

1. A non-volatile memory device comprising:
a plurality of horizontal electrodes extending lengthwise in a horizontal direction and stacked in a plurality of layers in a vertical direction;
a plurality of vertical electrodes arranged parallel to each other and extending lengthwise in the vertical direction, each of the vertical electrodes crossing one or more locations adjacent to one or more of the horizontal electrodes;
a plurality of data storage layers extending between the horizontal electrodes and the plurality of vertical electrodes to define respective memory cells at locations where the respective vertical electrodes cross adjacent horizontal electrodes, the data storage layers storing data by varying their respective electrical resistances; and
a plurality of reaction prevention layers arranged at the locations where the respective vertical electrodes cross adjacent horizontal electrodes.

2. The device of claim 1, wherein the plurality of reaction prevention layers comprises a plurality of first reaction prevention layers, located between the respective horizontal electrodes and corresponding data storage layers, and second reaction prevention layers located between the respective vertical electrodes and corresponding data storage layers.

3. The device of claim 1, wherein the plurality of reaction prevention layers comprises an oxide layer, a nitride layer, an oxinitride layer, or a layer formed of a combination of an oxide layer, a nitride layer and an oxinitride layer.

4. The device of claim 1, wherein the plurality of data storage layers comprises at least one of an aluminum oxide, a bismuth oxide, a titanium oxide, a vanadium oxide, a niobium oxide, a nickel oxide, a copper oxide, a zinc oxide, a tin oxide, a zirconium oxide, a silicon oxide, a hafnium oxide, a cobalt oxide, an iron oxide, carbon and silicon.

5. The device of claim 1, wherein at plurality of storage layers comprises at least one fuse.

6. The device of claim 1, wherein the plurality of data storage layers comprises at least one anti-fuse.

7. The device of claim 1, wherein the plurality of horizontal electrodes and the plurality of vertical electrodes cross each other at right angles.

8. The device of claim 1, wherein the horizontal electrodes and the vertical electrodes comprise polysilicon or metal.

9. The device of claim 8, wherein the horizontal electrodes and the vertical electrodes comprise at least one of tungsten (W), aluminum (Al), copper (Cu), molybdenum (Mo), titanium (Ti), tantalum (Ta), ruthenium (Ru), platinum (Pt), palladium (Pd), nickel (Ni), gold (Au), silver (Ag), beryllium (Be), bismuth (Bi), hafnium (Hf), indium (In), manganese (Mn), molybdenum (Mo), lead (Pb), rhodium (Rh), rhenium (Re), tellium (Te), zinc (Zn), zirconium (Zr), cobalt (Co), iridium (Ir), an alloy thereof, an oxide thereof, a nitride thereof, or a silicide thereof.

10. A non-volatile memory device comprising:
a plurality of horizontal electrode extending lengthwise in a horizontal direction and stacked in a plurality of layers in a vertical direction and comprising a first conductive type semiconductor;
a plurality of vertical electrodes arranged parallel to each other and extending lengthwise in the vertical direction, each of the vertical electrodes crossing one or more locations adjacent to one or more of the horizontal electrodes and comprising a second conductive type semiconductor arranged to cross the at least one horizontal electrode;
a plurality of data storage layers extending between the horizontal electrodes and the plurality of vertical electrodes to define respective memory cells at locations where the respective respectively vertical electrodes cross adjacent horizontal electrodes, the at least one data storage layer storing data by varying its electrical resistance; and
a plurality of reaction prevention layers arranged at locations where the respective vertical electrodes cross adjacent horizontal electrodes.

11. The device of claim 10, wherein the plurality of reaction prevention layers comprises a plurality of first reaction prevention layers, located between the respective horizontal electrodes and corresponding data storage layers, and second reaction prevention layers located between the respective vertical electrodes and corresponding data storage layers.

12. The device of claim 10, wherein the plurality of horizontal electrodes and the plurality of vertical electrodes cross each other at right angles.

* * * * *